United States Patent [19]

Adler

[11] Patent Number: 4,633,200
[45] Date of Patent: Dec. 30, 1986

[54] VOLTAGE CONTROLLED EQUALIZER
[75] Inventor: Alan J. Adler, Palo Alto, Calif.
[73] Assignee: Ampex Corporation, Redwood City, Calif.
[21] Appl. No.: 695,994
[22] Filed: Jan. 29, 1985
[51] Int. Cl.[4] .......................................... H03H 11/06
[52] U.S. Cl. ................................ 333/28 R; 330/295; 330/304; 360/65
[58] Field of Search ...................... 333/18, 28 R, 28 T; 330/124 R, 295, 304; 375/11, 12; 381/103; 307/358, 494, 529; 360/65

[56] References Cited

U.S. PATENT DOCUMENTS 2,920,281 1/1960 Appert et al. ................... 330/124 R
4,479,152 10/1984 Chi ..................................... 360/65 X Primary Examiner—Paul Gensler
Attorney, Agent, or Firm—Elizabeth E. Strnad; Joel D. Talcott

[57] ABSTRACT

A voltage controlled equalizer has two parallel signal paths. A first signal path is provided by a delay line coupled to an input of an amplifier. A control circuit is coupled between an input of the delay line and an output of the amplifier, via a second, parallel signal path. A control signal is applied to the control circuit to adjust the gain of the second signal path, thereby adjusting an amplitude versus frequency response characteristic of the equalizer. Signal delays caused by the control circuit are preferably selected substantially equal to those of the amplifier to compensate for undesired phase shifts of high frequency signals in the second signal path.

21 Claims, 11 Drawing Figures

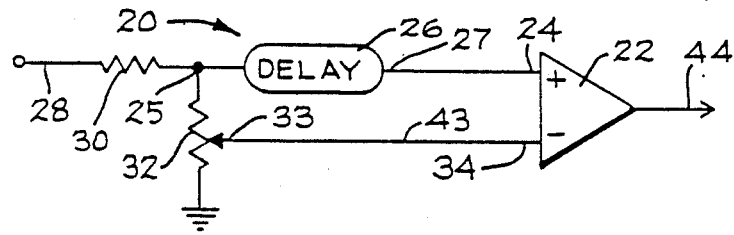
FIG_1 (PRIOR ART)
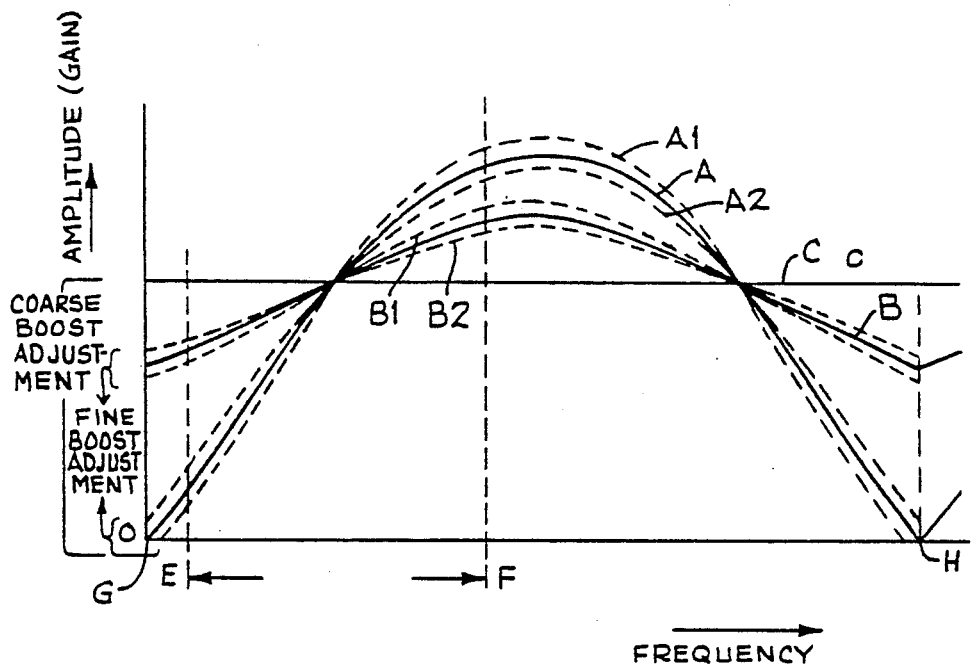
FIG_2
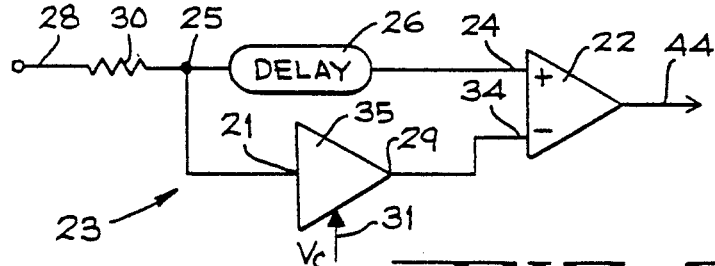
FIG_3

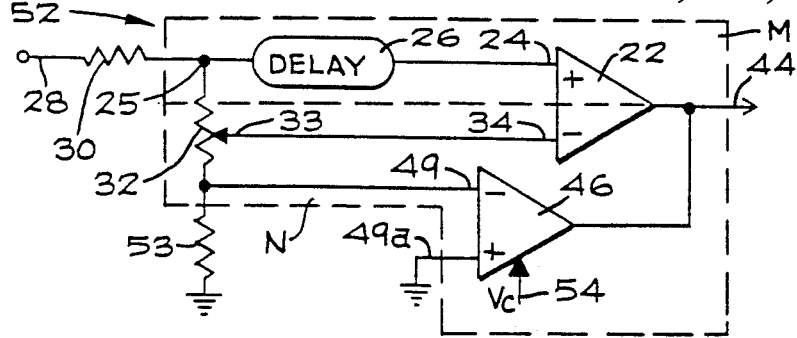
FIG_4
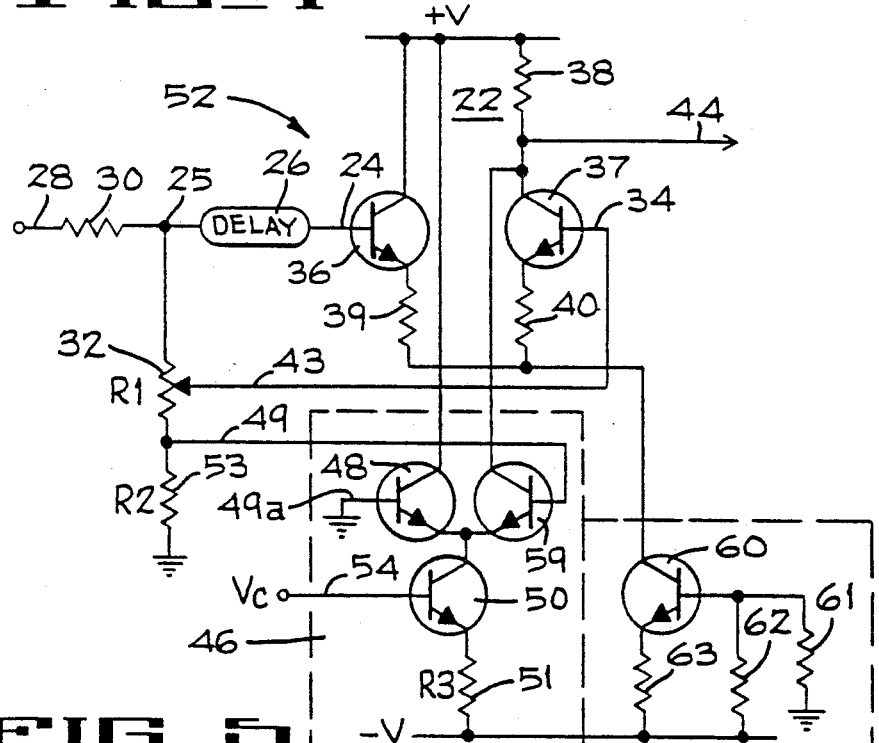
FIG_5
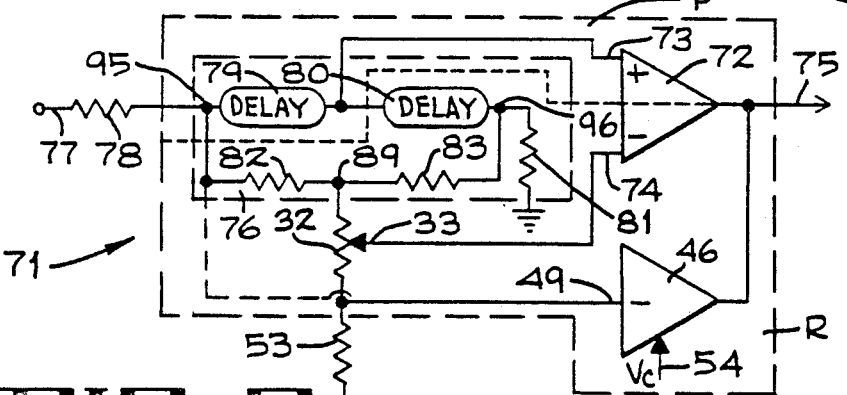
FIG_6

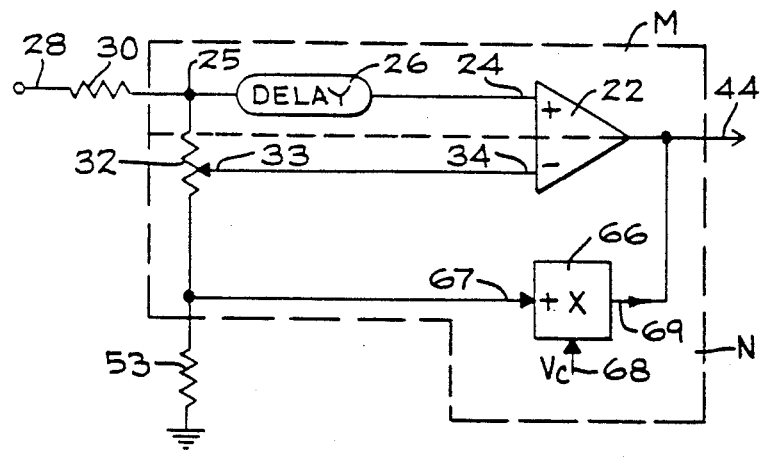
FIG_7A
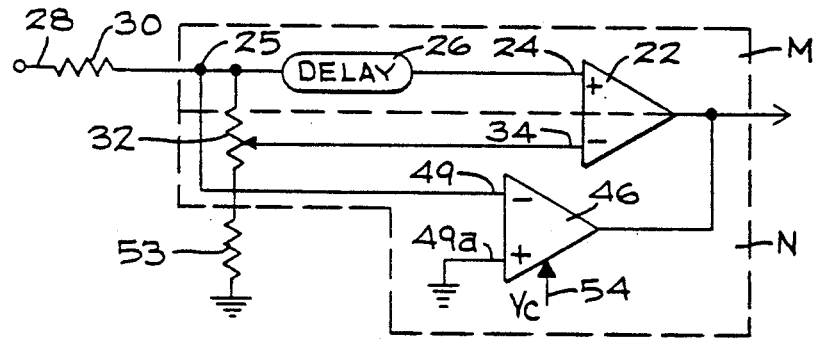
FIG_7B
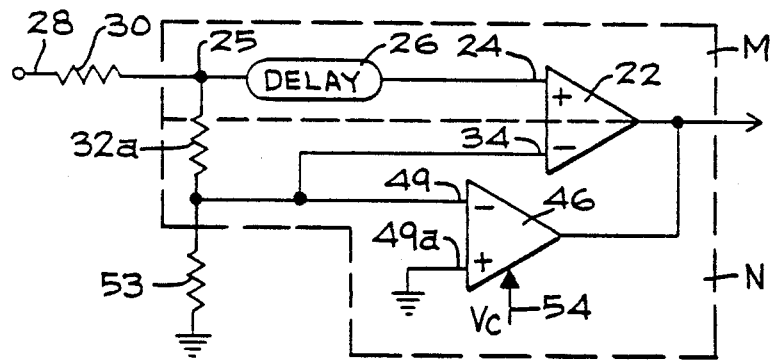
FIG_7C

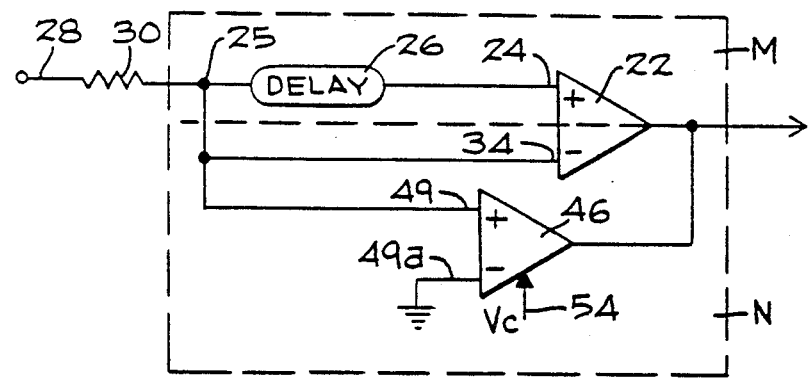
FIG_7D
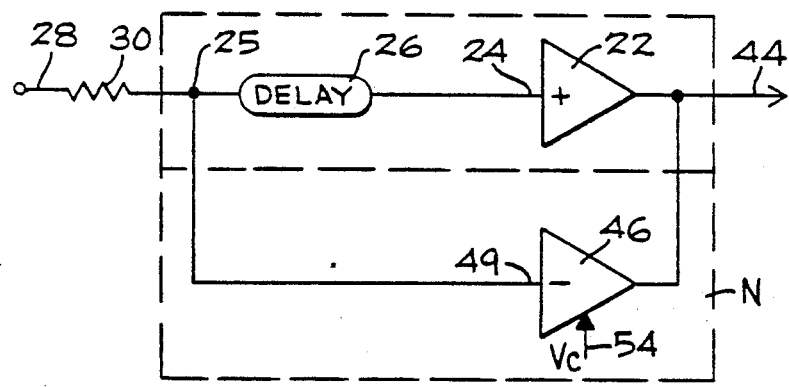
FIG_7E

VOLTAGE CONTROLLED EQUALIZER

Cross-reference is hereby made to concurrently filed U.S. patent application Ser. No. 695,995, filed on Jan. 29, 1985, entitled "Phase Scatter Detection and Reduction Circuit and Method" commonly assigned to Ampex Corporation, assignee of this patent application.

BACKGROUND OF THE INVENTION

The invention relates to a voltage controlled equalization circuit which is particularly suitable for equalization of signals transmitted over a channel having a non-uniform frequency response, including signals subjected to magnetic recording and reproduction processes.

A basic requirement for ideal signal transmission channel is the ability to transmit signals over a range of frequencies without introducing amplitude or phase changes dependent on frequency to avoid distortion. However, such transmitted signals are generally distorted due to a non-constant amplitude response and non-linear phase response inherent to the transmission process. Consequently, to obtain an accurate replica of the original signal upon reception or reproduction, it is necessary to compensate for the signal distortion.

A large variety of prior art amplitude equalizers are known which compensate for amplitude distortion of this type. These equalizers generally include circuits having an amplitude versus frequency response characteristic which compensates for the amplitude losses caused by the non-uniform frequency response of the channel. It is a general requirement that these amplitude equalizers do not introduce additional phase shift, and thereby distortion, into the equalized signal. To accurately match the amplitude versus frequency characteristic of the equalizer to that of the transmission channel, it is necessary to provide equalizers with adjustable response. Normally such amplitude equalizers have a gain response which rises with frequency. The amount of rise is called boost.

Delay line amplitude equalizers are known to utilize a delay line coupled between two inputs of a differential amplifier. More specifically, a delay line is coupled between an inverting and a non-inverting input of a differential amplifier. The differential amplifier operates as a difference circuit which provides an output signal corresponding to a difference between its input signals. The resulting circuit provides the desired equalization signal.

Known equalizers utilize manually operated potentiometers for the frequency response adjustment. Such potentiometers have an adjustable output, also known as a wiper contact, connected in the main equalization signal path. A minimum boost of the equalization signal is obtained when the adjustable wiper is positioned near one terminal while a maximum boost is obtained when the adjustable wiper is moved to the other, opposite terminal of the potentiometer. To adjust that equalizer boost it is necessary to mechanically adjust the position of the wiper contact of the potentiometer. The aforementioned electromechanical boost control is satisfactory for manually controlled equalizers having controls located close to the device. However, when the equalizer is at a location distant from the control station, remotely controlled mechanical means are necessary to obtain a desired adjustment.

Also, in applications utilizing automatic boost adjustment, for example by a computer generated electrical output signal, use of potentiometers would require additional devices for converting the electrical signal into a mechanical control signal.

Replacing the potentiometer for example by a remotely controllable voltage controlled amplifier introduces an undesirable delay into the equalization signal path at high frequencies and thus an additional phase shift, thereby upsetting the equalization process. Even when additional compensation networks are added to compensate for the delay, the quality of equalization is impaired in comparison with devices utilizing potentiometer control.

SUMMARY OF THE INVENTION

The above-indicated disadvantages of prior art equalizers are eliminated by the voltage controlled equalizer of the present invention.

The voltage controlled equalizer of the invention utilizes two parallel signal paths. The first path has a delay means receiving an input signal to be equalized and an amplifier having an input coupled to an output of the delay means. The second signal path has a control circuit having an input coupled to an input of the delay means and an output coupled to an output of the amplifier. The second signal path provides an output signal having an opposite polarity with respect to the signal polarity provided by the amplifier input. The gain of the second signal path may be adjusted by applying a control signal to the control circuit thereby adjusting the amplitude versus frequency response characteristic of the equalizer.

Consequently, in accordance with the invention, the amplitude versus frequency response characteristic of a delay line equalizer may be controlled remotely or automatically by controlling the gain of the second signal path which is coupled in parallel with the first signal path. For example, as the control circuit a voltage controlled amplifier or an analog multiplier may be utilized.

In the preferred embodiment, the equalizer of the present invention utilizes a first amplifier and a second, voltage controlled amplifier. Each amplifier has an input of opposite polarity with respect to the input of the other amplifier. A first equalization signal path is formed via a delay means and the first amplifier whose input is coupled to an output of the delay means. A second, voltage controlled equalization signal path is formed in parallel with the first signal path by the voltage controlled amplifier having its input coupled to an input of the delay means. The respective outputs of both amplifiers are connected together. A control signal is applied to a control input of the voltage controlled amplifier to control the gain thereof. By varying the gain of the voltage controlled amplifier the boost of the equalizer changes, thereby changing the amplitude versus frequency characteristic.

It is a significant advantage of the present invention that the voltage controlled, second equalization signal path is in parallel with the first equalization signal path. Consequently any additional delay provided by the control means may be compensated for and thus does not affect substantially the resulting equalized signal. Such compensation may be obtained by matching the delay and phase shift characteristics of the first amplifier and the voltage controlled amplifier, or of the first amplifier and the analog multiplier, respectively.

It is a further significant advantage of the invention that while varying the gain of the control circuit by applying a control signal from a remote location, both equalization signal paths can be kept relatively short with respect to the control signal path length. Also, the gain may be varied automatically, for example, utilizing computer control.

It is an important advantage of the present invention that the variable gain control in the second signal path may be used without the conventional potentiometer control, or alternatively, in combination therewith. In the latter case, when both controls are used, the potentiometer may be adjusted to obtain a coarse setting of a desired equalizer boost, while the voltage controlled amplifier may provide a remotely controlled fine setting of the equalizer boost. For example, a range of attenuation obtained by the potentiometer control may be greater by an order of a magnitude than the range provided by the voltage controlled amplifier.

As an example, the cross-referenced concurrently filed patent application describes a playback equalization circuit where the voltage controlled playback equalizer in accordance with the present invention is utilized to obtain a desired high frequency amplitude boost.

Preferred and alternative embodiments of the present invention utilizing a remotely or automatically adjustable gain control include cosine and transversal amplitude equalizers which are particularly useful in playback equalization of magnetically recorded and reproduced signals, as well as signals transmitted over a different type of channel, but the invention is not limited to these particular types of equalizers.

The foregoing and further objects, features and advantages of the invention will become apparent from the following detailed description and accompanying drawings.

BRIEF DESCRIPTION OF THE DRAWINGS

FIG. 1 shows an example of a known cosine equalizer utilizing conventional manual potentiometer boost control.

FIG. 2 shows an example of frequency responses of a delay line equalizer for various boost adjustments.

FIG. 3 shows a cosine equalizer in which the conventional manual boost control is replaced by a voltage controlled amplifier;

FIG. 4 shows a voltage controlled cosine equalizer in accordance with a preferred embodiment of the invention;

FIG. 5 shows a detailed circuit diagram corresponding to the equalizer of FIG. 4;

FIG. 6 shows a voltage controlled transversal equalizer in accordance with an alternative embodiment of the invention; and FIGS. 7A to 7E show alternative embodiments related to the embodiment of FIG. 4.

DETAILED DESCRIPTION

To facilitate the description of the invention, first an example of a prior art amplitude equalization circuit will be described, with reference to FIG. 1, utilizing a conventional potentiometer manual boost control. FIG. 1 shows a well known cosine amplitude equalizer 20 for providing high frequency amplitude boost. The equalizer 20 receives, via an input line 28, an input signal to be equalized. The signal on line 28 is applied via a series input resistor 30 and a delay line 26 to a noninverting first input 24 of a differential amplifier 22. The input signal on line 28 is also applied via resistor 30, adjustable wiper contact 33 of a potentiometer 32, and via line 43 to an inverting second input 34 of the amplifier 22. One terminal of the potentiometer 32 is coupled to a junction 25 between the delay line 26 and input resistor 30. The other, opposite terminal of potentiometer 32 is grounded.

In accordance with the well known operation of cosine equalizers, the input signal at the inverting input 34 of differential amplifier 22 is subtracted from the signal at the non-inverting input 24. The resulting difference signal at output terminal 44 from the differential amplifier 22 is the output signal from the conventional cosine equalizer 20 of FIG. 1. As well known from the principle of operation of cosine equalizers, the input impedance at input 24 of the differential amplifier 22 is relatively high so that the output of the delay line 26 does not become loaded or damped. Because of the high input impedance at 24, a large portion of the input signal passing thereto through the delay line 26 in one direction reflects and passes back through the delay line 26 in the opposite direction, to the junction 25 at the delay line input. Consequently the reflected portion of the input signal at 25 is twice delayed by the delay line 26. The reflected signal at the junction 25 is summed with an input signal received at 28. The sum of the two signals is applied via the wiper 33 of the potentiometer 32 and line 43 to the second input 34 of the differential amplifier 22.

Maximum boost of the equalizer response characteristic at the output 44 is obtained when the potentiometer 32 is set for minimum attenuation in the signal path between the terminals 25 and 34 of the circuit in FIG. 1. At the frequency of maximum boost the difference in delay between the respective input signals at inputs 24 and 34 of the differential amplifier 22 is substantially 180 degrees. Because of their opposite phase, the input signals at 24 and 34 are actually added by the differential amplifier 22. Consequently, the amplitude of the input signal at 28 is doubled at output 44 at that maximum boost frequency.

An example of a frequency response curve for the maximum boost setting by the potentiometer 32 is shown at A in FIG. 2. At those input signal frequencies of the equalizer at which the phase difference at the respective inputs 24, 34 is zero or an integral multiple of 360 degrees, the input signals at 24 and 34 cancel, as it is shown at points G and H in FIG. 2, depicting zero amplitude response.

Curve B in FIG. 2 shows the frequency response of the equalizer of FIG. 1 for an intermediate setting of the wiper 33 of potentiometer 32. That setting corresponds to a medium amount of boost obtained by attenuating the signal between the terminals 25 and 34. Curve C is a flat frequency response corresponding to zero boost of the equalizer response. It is obtained by moving the wiper 33 of the potentiometer 32 to the grounded terminal, whereby the signal path between terminals 25 and 34 is blocked. At that setting the differential amplifier 22 receives an input signal only at its first input 24 and the amplitude of the equalizer output signal at 44 is substantially constant with frequency.

The frequency range of interest in the presently described equalizer includes a portion E to F in the frequency response characteristic of FIG. 2. This particular operating range is selected because of the relatively steep increase of gain with frequency within that range.

It follows from the foregoing description that in the known delay line equalizers the amount of boost is controlled by adjusting the gain in the signal path between an input of the delay line and a second input of the differential amplifier, utilizing electromechanical controls.

To obtain a remotely or automatically controllable equalizer, the applicant first tried to replace the potentiometer 33 with a voltage controlled amplifier 35 as it is shown in FIG. 3. The voltage controlled amplifier 35 has an input 21 coupled to the input 25 of the delay line 26 and an output 29 coupled to the second input 34 of the differential amplifier 22. A control voltage Vc is applied via a control input 31 to the amplifier 35 to vary the gain thereof. By varying the gain of amplifier 35 between a minimum and a maximum gain, frequency response characteristics corresponding to the previously described characteristics A to C are obtained at the output 44 from the equalizer 23 of FIG. 3.

However, in the circuit of FIG. 3 additional undesirable frequency dependent signal delays have been introduced by the voltage controlled amplifier 35 in the signal path between points 25 and 34. Various frequency dependent circuits (not shown) have been added to compensate for the additional delay but the thusly obtained quality of equalization did not match the quality obtained by the potentiometer gain adjustment.

A preferred embodiment of the present invention which eliminates the above-described disadvantages of the prior art equalizers as well as the disadvantages of the circuit of FIG. 3 is shown in FIG. 4 and will be described now.

It is noted that in the present application like elements are designated by like reference numerals in all the drawing FIGURES to facilitate comparison.

The circuit of FIG. 4 basically corresponds to the previously described circuit of FIG. 1 with the exception of a voltage controlled amplifier 46 coupled in parallel with the equalization signal path formed by the delay line 26 and the differential amplifier 22. In the preferred embodiment of FIG. 4 the voltage controlled amplifier 46 has an inverting input 49 connected to receive the input signal on line 28 attenuated by the input resistor 30 and a voltage divider formed by a series combination of potentiometer 32 and a resistor 53. The amplifier 46 has an output connected to the output 44 of the differential amplifier 22. The resulting signal path provided by the voltage controlled amplifier 46 is in parallel with the equalization signal path of the differential amplifier 22.

The differential amplifier 22 and the voltage controlled amplifier 46 of the embodiment of FIG. 4 are constructed to preferably have the same number of amplification stages providing a substantially identical amount of signal delay. As a result, the respective output signals at 44 of the differential amplifier 22 and of the voltage controlled amplifier 46 have substantially the same relative phase relationship as the respective input signals at inputs 34 and 49. Consequently, no substantial phase distortion is introduced by the amplifier 46 into the signals summed at terminal 44.

It follows from the foregoing description of the circuit of FIG. 4 that two parallel equalization signal paths are provided as follows. A first signal path M is provided from the junction 25 via the delay line 26 and the first, non-inverting input 24 to output 44 of the differential amplifier 22. A second signal path N is formed from the junction 25 via potentiometer 32 and the second, inverting input 34 to output 44, of amplifier 22, in parallel with the signal path from junction 25, via potentiometer 32 and input 49 to output 44 of amplifier 46. The signal transferred via the second signal path N has an inverted polarity with respect to the signal transferred from the first input 24 to output 44 of the amplifier 22 of the first signal path M. These respectively inverted signal polarities provide a difference signal at the output 44 of the equalizer, as it is necessary for the equalization operation.

As an example, the voltage controlled amplifier 46 in FIG. 4 is implemented by a differential amplifier whose inverting input is coupled to receive an input signal via the previously described voltage divider 32, 53 while its other, non-inverting input is grounded. It is understood that a voltage controlled amplifier having just one input may be utilized instead. The boost of the equalization signal obtained at output 44 is adjusted by changing a control voltage Vc applied at the control input 54 of the amplifier 46, as it will be described in more detail below.

It is seen from the foregoing description of FIG. 4 that the output signals of both amplifiers 22, 46 are summed at the output 44 of the equalization circuit 52 of the invention. In case both the potentiometer 32 and the voltage controlled amplifier 46 are utilized for boost adjustment, as it is shown in the example of FIG. 4, the potentiometer 32 can be manually adjusted to obtain a coarse adjustment of a desired equalizer boost. Fine boost adjustment can then be obtained by remotely adjusting the control voltage applied on line 54 to the voltage controlled amplifier 46. For example, a range of attenuation obtained by the potentiometer control may be greater by an order of a magnitude than the range provided by the voltage controlled amplifier.

However, in case the potentiometer 32 is deleted from the circuit of FIG. 4 as it is described below, the entire range of necessary boost adjustment is provided by the control voltage on line 54.

The previously described frequency response characteristics A to C of FIG. 2 also correspond to the operation of the equalization circuit of FIG. 4. The maximum boost setting, as shown by characteristic A, is obtained when the combined gains of the previously described parallel signal path N from junction 25 via potentiometer 32 and input 34 to output 44 of amplifier 22 and from junction 25 via potentiometer 32 and input 49 to output 44 of amplifier 46, add up to equal the gain of the previously described signal path M from junction 25 via the delay line 26 and input 24 to the output 44 of the differential amplifier 22. An intermediate boost setting as shown by the characteristic B is obtained when the gain of signal path N is set lower than the gain of signal path M. The flat response characteristic C is obtained when the gain of the signal path N is set to zero.

When a potentiometer is utilized as previously described with reference to potentiometer 32 of FIG. 4, first a coarse boost adjustment may be obtained by manually adjusting the wiper 33 of the potentiometer 32. Thereafter the gain of the voltage controlled amplifier may be adjusted remotely to obtain a fine adjustment of the equalizer boost, thereby finely adjusting the frequency response characteristic. Examples of finely adjusted characteristics A1, A2 and B1, B2 are shown by interrupted lines in FIG. 2.

It is understood with respect to the well known properties of differential amplifiers that in the preferred embodiment of FIG. 4 the non-inverting input 24 of the differential amplifier 22 and its inverting input 34 may be reversed. In that case, the inverting input 49 and the non-inverting input 49a of the voltage controlled amplifier 46 are also reversed. The polarity of the resulting output signal at 44 is thereby also reversed.

As an alternative to the equalization circuit of the preferred embodiment shown in FIG. 4, further variations of that circuit are shown in FIGS. 7A to 7E.

In the circuits of FIGS. 7A to 7E respective signal paths M, N are shown which correspond to the previously described signal paths M, N of FIG. 4.

FIG. 7A shows an alternative embodiment related to FIG. 4, where the voltage controlled amplifier 46 is replaced by an analog multiplier 66. A first input 67 of the multiplier is coupled to the voltage divider 32, 53, similarly as the previously described input 49 of the voltage controlled amplifier 46 of FIG. 4. A second input 68 of the multiplier 66 receives the previously described control voltage Vc. An output 69 of the multiplier 66 is coupled to the output 44 of the equalizer of FIG. 7A. In the embodiment of FIG. 7A, for example a type CA 3019D analog multiplier, manufactured by Radio Corporation of America, may be utilized.

As it is known from a conventional analog multiplier, it provides an output signal which corresponds to a product of its respective input signals. Consequently, the multiplier 66 provides a positive or negative output signal on line 69, depending on the polarity of the respective input signals on lines 67, 68. For example, with particular reference to the embodiment of FIG. 7A, when a control signal Vc having a positive polarity is applied to input 68 a resulting positive signal on line 69 will be subtracted from the signal provided via the inverting input 34 of the differential amplifier 22 in signal path N. As a result, a thusly applied positive control signal Vc decreases the resulting gain of the signal path N. On the other hand, when a control signal Vc of a negative polarity is applied, a resulting negative signal on line 69 is added to the signal transmitted via the inverting input 34 of amplifier 22. The resulting gain of signal path N will thus increase with a negative control signal Vc. In the embodiment of FIG. 7A, it is preferred to select amplifier 22 and analog multiplier 66 to have similar signal delays, thus preserving substantially the same phase relationship of their output signals at 44 and 69 which exist at inputs 24 and 67.

In FIG. 7B the input 49 of the voltage controlled amplifier 46 is connected directly to the input 25 of the delay line 26. Consequently, the input signal at 49 is not attenuated by the voltage divider 32, 53.

In FIG. 7C the potentiometer 32 is replaced by a fixed resistor 32a and the respective inputs 34, 49 of amplifiers 22, 46 and interconnected. In this circuit the entire range of boost adjustment is obtained by adjusting the control voltage Vc.

In FIG. 7D the voltage divider 32, 53 is deleted entirely and the respective inputs 34, 49 of amplifiers 22, 46 are both connected to the input 25 of the delay line 26 without attenuation. In this circuit the signal path from junction 25 through the input 34 of amplifier 22 is set to obtain a maximum boost. The polarity of the voltage controlled amplifier 46 at input 49 is reversed with respect to the polarity of input 34 so that a reduction of that maximum boost may be obtained by applying the control voltage Vc at 54.

In FIG. 7E a simplified embodiment of a voltage controlled cosine equalizer of the present invention is shown. In this embodiment the first signal path M has an amplifier with only one input, for example a non-inverting input 24. As in the previously described embodiments, that non-inverting input is coupled to the output of the delay line 26. The second signal path N, which is parallel with signal path M, has a voltage controlled amplifier 46, with an inverting input 49 coupled to the input 25 of delay line 26, as described before. In this particular embodiment the entire signal path N is provided by the voltage controlled amplifier 46. Thus, the signal from junction 25, corresponding to the sum of the undelayed and twice delayed signals, as previously described, is inverted by amplifier 46. The inverted signal is summed with the non-inverted signal via path M at the output 44 of the equalizer of FIG. 7E to obtain a difference signal, as is necessary for the equalization operation as previously described.

However, there is a disadvantage associated with the embodiment of FIG. 7E as follows. Voltage controlled amplifiers, such as 46 are known to produce harmonic distortion when driven with moderate to high level input signals. Because in this embodiment the entire range of control of the equalization circuit is provided by the voltage controlled amplifier 46, the input signal amplitude range is limited to low level input signals in order to minimize distortion.

Therefore, it is preferred to utilize as the first amplifier 22 a differential amplifier, having a second input coupled to the input of the delay line 26, to form a portion of the signal path N in parallel with the signal path provided by the voltage controlled amplifier 46, as it is has been previously described with reference to FIGS. 4 to 7D.

A more detailed circuit diagram corresponding to the equalizer of FIG. 4 is shown in FIG. 5. As it is seen from FIG. 5, the differential amplifier 22 is implemented by a pair of transistors 36, 37 whose collectors are coupled to a positive DC voltage supply. The emitters of transistors 36, 37 are each connected via respective series resistors 39, 40 to one terminal of a current source 42. The other terminal of the current source 42 is coupled to a negative DC voltage supply. The base of transistor 36 corresponds to the non-inverting input 24 while the base of transistor 37 corresponds to the inverting input 34 of the differential amplifier 22 of FIG. 4.

The current source 42 is implemented in a well known manner by a transistor 60 having its collector connected to the emitters of transistors 36, 37, via respective resistors 39, 40. The emitter of transistor 60 is connected to a negative D.C. voltage supply via a series resistor 63. The base of transistor 60 is connected to that voltage supply via a voltage divider comprising series resistors 61 and 62 of which resistor 61 is grounded.

The voltage controlled amplifier 46 comprises two transistors 48, 59 which have their emitters connected together to a negative D.C. voltage supply via a control transistor 50. The base of transistor 59 is connected to a voltage divider provided by the previously described potentiometer 32 and a series resistor 53 whose other terminal is grounded. The base of the transistor 48 is grounded. The collector of transistor 48 is connected to the previously described positive voltage supply. The collector of the transistor 59 is connected to the collector of transistor 37, that is to output 44 of the equalizer 52. The collector of the control transistor 50 is connected to interconnected emitters of transistor 48, 59 and its emitter is connected via a current setting resistor 51 to the negative D.C. voltage supply.

The base of the control transistor 50 provides a control input 54 for receiving a control voltage Vc for adjusting the amount of current flowing through the transistors 48 and 59 of the voltage controlled amplifier 46. The gain of amplifier 46 is controlled by that control voltage. The respective outputs from the differential amplifier 22 and voltage controlled amplifier 46 are summed and the resulting output signal from the equalizer 52 on line 44 has a desired boost of the frequency response characteristic. The control voltage on line 54 may be applied from a remote location or for example by computer control. The transistors 36, 37 and 48, 59 are selected such that the signal delays in the respective signal paths through transistors 36, 37 are substantially equal to those of the parallel path through transistors 48 and 59. A resulting proper timing of the respective signals summed at the output 44 is thereby obtained.

In the preferred embodiment of FIG. 5 the delay line 26 is preferably implemented by a 15 nanosecond delay line, type MDO15Z100 manufactured by Allen Avionics, Incorporated and the transistors 36, 37, 48, 59, 50 and 60 are type 2N4259 manufactured by National Semiconductors Corporation. However, the above-indicated delay may vary, depending on the desired range of signal frequencies.

The voltage controllable range of adjustment of the equalization circuit of FIG. 5 is set by proper selection of resistor values 32, 51 and 53. Decreasing the ratio of resistance values R2/R1, where R1 is the value of resistor 32 and R2 is the value of resistor 53 or, alternatively, decreasing the value R3 of resistor 51 will increase the voltage controllable range. However, in most applications it is desirable to limit that range to avoid harmonic distortion caused by the voltage controlled amplifier 46. Limiting the voltage controllable range also prevents the system from being adjusted too far from its proper setting.

Tests performed with the preferred embodiment of the present invention shown in FIG. 5 yielded low distortion of the resulting equalized signal. For example for signals less than 2 Volts peak-to-peak a total harmonic distortion of less than −50 dB, that is less than 0.3 percent has been obtained.

It is understood from the foregoing description that in the circuit of FIG. 5 the boost of the equalizer 52 can be remotely controlled primarily by varying the voltage Vc at the control input 54. However, in addition to the remote control, the boost may be controlled also manually by the potentiometer 32 as it has been described previously with reference to FIGS. 1 and 2. For example, the potentiometer 32 may be set to obtain a coarse value of a desired boost and a fine boost setting may be obtained by the control voltage at 54. It is seen from the foregoing description that the gain of the voltage controlled amplifier 46 is dependent on the current supplied by transistor 50 which is in turn controlled by its base voltage.

FIG. 6 shows an alternative embodiment of the voltage controlled equalizer of the present invention utilizing a different type of delay line equalizer as it will be described below.

The circuit of FIG. 6 shows a voltage controlled transversal equalizer 71 in accordance with the present invention. The transversal equalizer 71 has a conventional transversal filter 76 coupled between a non-inverting input 73 and an inverting input 74 of a differential amplifier 72, to obtain a desired signal delay and thus a desired phase shift between the respective input signals of the amplifier 72. The transversal filter 76 has a series combination of a first delay line 79 and a second delay line 80 connected in parallel with series resistors 82, 83. In the preferred embodiment the delay lines 79, 80 are selected to provide an equal amount of delay and the resistors 82, 83 have equal resistance values. Alternatively, a single delay line with a central tap may be utilized. A resistor 81 is connected between a junction of the second delay line 80 with resistor 83 and the ground. A junction between the first delay line 79 and resistor 82 is connected via an input resistor 78 to an input terminal 77. A junction between the delay lines 79, 80 is connected to the first input 73 of the differential amplifier 72. A voltage divider, such as previously described with reference to FIG. 4, comprising potentiometer 32 and resistor 53 is coupled between a junction 89 of resistors 82, 83 and ground. The moveable contact 33 of potentiometer 32 is connected to the inverting input 74 of the differential amplifier 72.

As it is well known from the operation of transversal equalizers, the delay lines 79, 80 are selected to have an equal delay of 180 degrees for a selected frequency, corresponding to a frequency of maximum response. Consequently, when an input signal having such selected frequency is obtained at input 77, it is applied via resistor 78 and first delay line 79 to the first input 73 of the differential amplifier 72. The junction 89 receives the input signal to be equalized via resistors 78 and 82. It also receives via resistor 83 that input signal twice delayed by 180 degrees by the delay lines 79, 80. Because the delay effects substantially high frequency signal components, these components appear at the inputs 73, 74 of the amplifier 72 as being of opposite phase and therefore they are actually added together by the differential amplifier 72. The resulting output signal at 75 has an amplitude substantially equal to twice the amplitude of the input signal at 77.

However, low frequency signals are not substantially phase shifted by the delay lines 79, 80 and thus they are attenuated by the signal subtraction at the inputs 73, 74 of the differential amplifier. As it is further known from the operation of transversal equalizers, medium and high frequency signals within a selected frequency range will have a desired amplitude boost while the amplitude of the highest frequency signals within that selected range will be substantially doubled by the equalizer, similarly as it has been previously described with respect to the cosine equalizer of FIG. 1 and shown by the characteristics of FIG. 2.

In accordance with the present invention, in the embodiment of FIG. 6 a voltage controlled amplifier 46 is coupled in parallel between the input 95 of the delay line 79 and the output 75 of the differential amplifier 72, in a manner similar to the previously described embodiment of FIG. 4. It is understood from the foregoing description that the boost of the amplitude versus frequency characteristic of the equalizer 71 of FIG. 6 can be controlled from a remote location or by an automatic control device, by varying the voltage Vc applied to the control input 54 of the voltage controlled amplifier 46.

Similarly as in the previously described circuit of FIG. 4 the potentiometer 32 may be utilized to coarsely adjust the boost of the equalizer of FIG. 6 by manually adjusting the position of wiper 33. The amplitude boost of the equalizer 71 reaches maximum when the gain of the signal path from junction 95 through delay line 79 and the first input 73 to output 75 of the differential amplifier 72, further referred to as signal path P, is equal to the combined gains of the signal paths from junction 95 via resistor 82 and from junction 96 via resistor 83, potentiometer 32 and input 49 to output 75 of amplifier 46 and of the signal paths from 95 via 82 and from 96 via 83 and via potentiometer 32 and the second input 74 to output 75 of amplifier 72, further referred to as signal path R. The above-indicated maximum boost setting of the equalizer of FIG. 6 corresponds to the previously described equalization characteristic A shown in FIG. 2. Analogously with the previously described embodiments, the characteristic B of FIG. 2 is obtained when the gain of the signal path R is set lower than the gain of signal path P. Still analogously, the flat response characteristic C is obtained when the gain of the signal path R is set to zero.

As a further alternative embodiment, the voltage controlled amplifier 46 in FIGS. 6 and 7B to 7E may be replaced by different control means, such as an analog multiplier 66 shown in FIG. 7A.

Other circuit variations of the embodiment of the invention shown in FIG. 6 may be made similar to those previously described and shown in FIGS. 7A to 7D. Thus, the potentiometer 32 may be replaced by a fixed resistor. Alternatively, the voltage divider 32, 53 may be deleted from the circuit. In the above-indicated circuit variations the input 74 of the differential amplifier may be interconnected with input 49 of amplifier 46, or any of the inputs 74, 49 may be connected to the input 95 of delay line 79, depending on the amount of attenuation desired in the respective signal paths. One such circuit variation is shown in FIG. 6 by an interrupted line connecting input 49 of voltage controlled amplifier 46 to input 95 of delay line 79.

It follows from the foregoing description that in all the preferred and alternative embodiments of the invention the control circuit, such as the voltage controlled amplifier or multiplier, is coupled in parallel with the equalization signal path provided by the delay means and the first amplifier 22.

While the invention has been particularly shown and described with reference to embodiments thereof, it will be appreciated that various alternatives and modifications may be made which will fall within scope of the appended claims.

What is claimed:

1. A voltage controlled equalizer having an amplitude versus frequency response characteristic, comprising:
   a first signal path comprising a delay means having an input coupled to receive an input signal to be equalized and to provide known phase shifts thereof within a predetermined frequency range, and an amplifier means having a first input coupled to an output of said delay means; and
   a second signal path in parallel with the first signal path coupled to provide a signal of opposite polarity with respect to a polarity provided by said first input of said amplifier means, said second signal path having a control means having an input coupled to said input of the delay means and an output coupled to an output of said amplifier means and having a control input coupled to receive a control signal to adjust the gain of said second signal path, thereby adjusting the amplitude versus frequency response characteristic of said equalizer.

2. The voltage controlled equalizer of claim 1, wherein said first and second signal paths provide substantially equal amounts of signal delay.

3. The voltage controlled equalizer of claim 1, wherein said control means is a second, voltage controlled amplifier means.

4. The voltage controlled equalizer of claim 1, wherein said control means is an analog multiplier means.

5. The voltage controlled equalizer of claim 1 wherein said amplifier means is a differential amplifier means, having a second input of an opposite polarity with respect to said first input and wherein said second input is coupled to said input of said control means in said second signal path.

6. A voltage controlled equalizer having an amplitude versus frequency response characteristic, comprising:
   delay means having an input coupled to receive an input signal to be equalized and to provide known phase shifts thereof within a predetermined frequency range;
   first amplifier means having an input of a first polarity coupled to an output of said delay means; and
   second, voltage controlled amplifier means having an input of a second polarity, opposite said first polarity coupled to said input of said delay means, an output coupled to an output of said first amplifier means, and having a control input coupled to receive a control signal to adjust the gain of said voltage controlled amplifier means to thereby adjust said amplitude versus frequency response characteristic of said equalizer.

7. The voltage controlled equalizer of claim 6, wherein said first and second amplifier means are selected to provide substantially equal amounts of signal delay.

8. The voltage controlled equalizer of claim 6 wherein said first amplifier means is a differential amplifier means having a second input of a second polarity, opposite said first polarity, coupled to said input of said delay means.

9. The voltage controlled equalizer of claim 8 further comprising a voltage divider means having an input terminal coupled to said input of said delay means and wherein said second input of said differential amplifier means and said input of said voltage controlled amplifier means are coupled to said input of said delay means via said voltage divider means.

10. The voltage controlled equalizer of claim 8 further comprising a voltage divider means having an input terminal coupled to said input of said delay means, and an adjustable output terminal coupled to said second input of said differential amplifier means for obtaining an additional adjustment of said amplitude versus frequency response characteristic of said equalizer.

11. The voltage controlled equalizer of claim 8 wherein said voltage controlled amplifier means has an input transistor having a base coupled to said second input of said differential amplifier means and having a collector coupled to said output of said differential amplifier means;
   said voltage controlled amplifier means further comprising a control transistor having a collector coupled to the emitter of said input transistor, an emitter coupled to a voltage supply and a base coupled to receive said control signal as a variable input voltage for adjusting a gain of said input transistor, thereby adjusting said amplitude versus frequency response characteristic of said equalizer.

12. The voltage controlled equalizer of claim 8 wherein said delay means is a delay line, said equalizer further comprising a voltage divider means having a series combination of a potentiometer and a resistor coupled between said input of said delay line and ground, said potentiometer having an adjustable terminal coupled to said second input of the differential amplifier and wherein said input of said voltage controlled amplifier is coupled to an output of said voltage divider.

13. The voltage controlled equalizer of claim 8 wherein said delay means comprises a transversal filter means having a first and a second delay line connected in series, a junction between said delay lines being coupled to said first input of said differential amplifier means, said transversal filter further comprising a series combination of a first and second resistor connected in parallel with said first and second delay line, a junction between said second resistor and second delay line being coupled to ground via a third resistor, a junction between said first and second resistor being coupled to said second input of said differential amplifier means.

14. The voltage controlled equalizer of claim 13 further comprising a voltage divider means having a series combination of a potentiometer and a fourth resistor coupled between said junction of said first and second resistor and ground, said potentiometer having an adjustable terminal coupled to said second input of said differential amplifier means and wherein said input of said voltage controlled amplifier means is connected to an output of said voltage divider means.

15. A voltage controlled equalizer having an amplitude versus frequency response characteristic, comprising:
differential amplifier means having a first input of a first polarity and a second input of a second, opposite polarity, and an output coupled to provide an output signal corresponding to a difference between respective signals received at said first and second input;
delay means having an input coupled to receive an input signal to be equalized and to provide known phase shifts thereof within a predetermined frequency range;
said differential amplifier means having its first input coupled to an output of said delay means and having its second input coupled to said input of said delay means; and
voltage controlled amplifier means having an input of said second polarity coupled to said second input of said differential amplifier means, an output coupled to said output of said differential amplifier means, and having a control input for receiving a control signal to adjust the gain of said voltage controlled amplifier means to thereby adjust said amplitude versus frequency response characteristic of said equalizer.

16. The voltage controlled equalizer of claim 15, wherein said differential amplifier means and said voltage controlled amplifier means are selected to provide substantially equal amounts of signal delay.

17. A voltage controlled cosine equalizer having an amplitude versus frequency response characteristic, comprising:
differential amplifier means having a first and a second input and an output;
delay means having an input coupled to receive an input signal to be equalized and to provide known phase shifts thereof within a predetermined frequency range;
said differential amplifier means having its first input coupled to an output of said delay means and having its second input coupled to said input of said delay means; and
voltage controlled amplifier means having an input coupled to said second input of said differential amplifier means and having an output coupled to said output of said differential amplifier means and wherein said voltage controlled amplifier means further comprises a control input for receiving a control signal for adjusting the gain thereof, thereby adjusting said amplitude versus frequency response characteristic of said equalizer.

18. A voltage controlled cosine equalizer having an amplitude versus frequency response characteristic, comprising:
differential amplifier means having a first and a second input and an output;
delay means having an input coupled to receive an input signal to be equalized and having an output coupled to said first input of said differential amplifier means;
voltage divider means having a potentiometer with two opposite terminals coupled between said input of said delay means and ground, said potentiometer having an adjustable terminal coupled to said second input of said differential amplifier means for providing a first adjustment of said amplitude versus frequency response characteristic; and
voltage controlled amplifier means having an input coupled to an output of said voltage divider means and having an output coupled to said output of said differential amplifier means and wherein said voltage controlled amplifier means further comprises a control input for receiving a control signal for providing a second adjustment of said amplitude versus frequency response characteristic of said equalizer.

19. A voltage controlled transversal equalizer, having an amplitude versus frequency response characteristic, comprising:
differential amplifier means having a first and a second input and an output;
transversal filter means having a series combination of a first and a second delay means coupled in parallel with a series combination of a first and a second resistor means, a junction between said first delay means and first resistor means being coupled to receive an input signal to be equalized, a junction between said second delay means and second resistor means being coupled to ground, a junction between said first and second delay means being coupled to said first input of said differential amplifier means and said second input of the differential amplifier means being coupled to a junction between said first and second resistor means; and
voltage controlled amplifier means having an input coupled to said second input of said differential amplifier means, an output coupled to said output of said differential amplifier means and having a control input for receiving a control signal to adjust the gain of said voltage controlled amplifier means, thereby adjusting said frequency response characteristic of said equalizer.

20. The voltage controlled transversal equalizer of claim 19 further comprising a voltage divider means having a potentiometer with two opposite terminals coupled between said junction of said first and second resistor and ground, said potentiometer having an adjustable terminal coupled to said second input of said differential amplifier means, and wherein said input of said voltage controlled amplifier means is coupled to an output of said voltage divider means.

21. A voltage controlled equalizer having an amplitude versus frequency response characteristic, comprising:

a delay means having an input coupled to receive an input signal to be equalized and to provide known phase shifts thereof within a predetermined frequency range;

a differential amplifier means having a first input of a first polarity coupled to an output of said delay means and having a second input of a second, opposite polarity coupled to said input of said delay means; and a multiplier means having a first input coupled to said input of the delay means, an output coupled to an output of said differential amplifier means and a second input coupled to receive a control signal for adjusting a gain of a signal path provided by said multiplier, thereby adjusting the amplitude versus frequency response characteristic of said equalizer.

* * * * *